(12) United States Patent
Kalchbrenner et al.

(10) Patent No.: US 12,141,691 B2
(45) Date of Patent: Nov. 12, 2024

(54) GENERATING OUTPUT EXAMPLES USING RECURRENT NEURAL NETWORKS CONDITIONED ON BIT VALUES

(71) Applicant: DeepMind Technologies Limited, London (GB)

(72) Inventors: Nal Emmerich Kalchbrenner, London (GB); Karen Simonyan, London (GB); Erich Konrad Elsen, San Francisco, CA (US)

(73) Assignee: DeepMind Technologies Limited, London (GB)

( * ) Notice: Subject to any disclaimer, the term of this patent is extended or adjusted under 35 U.S.C. 154(b) by 1071 days.

(21) Appl. No.: 16/968,413

(22) PCT Filed: Feb. 11, 2019

(86) PCT No.: PCT/EP2019/053300
§ 371 (c)(1),
(2) Date: Aug. 7, 2020

(87) PCT Pub. No.: WO2019/155054
PCT Pub. Date: Aug. 15, 2019

(65) Prior Publication Data
US 2020/0401874 A1  Dec. 24, 2020

Related U.S. Application Data

(60) Provisional application No. 62/628,913, filed on Feb. 9, 2018.

(51) Int. Cl.
*G06N 3/08* (2023.01)
*G06F 18/2113* (2023.01)
(Continued)

(52) U.S. Cl.
CPC ............ *G06N 3/08* (2013.01); *G06F 18/2113* (2023.01); *G06N 3/045* (2023.01); *G06N 3/063* (2013.01); *H03K 19/173* (2013.01)

(58) Field of Classification Search
CPC .......... G06N 3/045; G06N 3/063; G06N 3/08; G06F 18/2113; H03K 19/173
See application file for complete search history.

(56) References Cited

U.S. PATENT DOCUMENTS

| 10,482,373 | B1 * | 11/2019 | Kalchbrenner | ........ | G06N 3/045 |
| 2018/0336455 | A1 * | 11/2018 | Kalchbrenner | ........ | G06N 3/088 |

FOREIGN PATENT DOCUMENTS

| AU | 2014221248 | 9/2014 |
| CN | 103106535 | 5/2013 |

(Continued)

OTHER PUBLICATIONS

Van den Oord et al., WaveNet: A Generative Model for Raw Audio, Sep. 2016. (Year: 2016).*

(Continued)

*Primary Examiner* — Marshall L Werner
(74) *Attorney, Agent, or Firm* — Fish & Richardson P.C.

(57) ABSTRACT

Methods, systems, and apparatus, including computer programs encoded on computer storage media, for generating output examples using neural networks. Each output example includes multiple N-bit output values. To generate a given N-bit output value, a first recurrent input comprising the preceding N-bit output value is processed using a recurrent neural network and in accordance with a hidden state to generate a first score distribution. Then, values for the first half of the N bits are selected. A second recurrent input comprising (i) the preceding N-bit output value and (ii) the values for the first half of the N bits are processed using the recurrent neural network and in accordance with the same hidden state to generate a second score distribution.

(Continued)

The values for the second half of the N bits of the output value are then selected using the second score distribution.

18 Claims, 3 Drawing Sheets

(51) Int. Cl.
    *G06N 3/045* (2023.01)
    *G06N 3/063* (2023.01)
    *H03K 19/173* (2006.01)

(56) References Cited

FOREIGN PATENT DOCUMENTS

| | | |
|---|---|---|
| CN | 107145940 | 9/2017 |
| KR | 20120070934 | 7/2012 |

OTHER PUBLICATIONS

Mehri et al., SampleRNN: An Unconditional End-to-End Neural Audio Generation Model, Feb. 2017. (Year: 2017).*

Van den Oord et al., Pixel Recurrent Neural Network, Aug. 2016. (Year: 2016).*

Office Action in European Appln. No. 19704794.7, dated Nov. 30, 2022, 7 pages.

Kalchbrenner et al., "Efficient Neural Audio Synthesis," CoRR, Feb. 2018, https://arxiv.org/abs/1802.08435, 10 pages.

Mehri et al., "SampleRNN: An Unconditional End-to-End Neural Audio Generation Model," CoRR, Dec. 2016, https://arxiv.org/abs/1612.07837, 11 pages.

PCT International Search Report and Written Opinion in International Appln. No. PCT/EP2019/053300, dated May 29, 2019, 14 pages.

Van Den Oord et al., "Pixel Recurrent Neural Networks," CoRR, Jan. 2016, https://arxiv.org/abs/1601.06759, 11 pages.

Notice of Allowance in Chinese Appln. No. 201980008378.7, dated Jun. 7, 2024, 8 pages (with machine translation).

* cited by examiner

GENERATING OUTPUT EXAMPLES USING RECURRENT NEURAL NETWORKS CONDITIONED ON BIT VALUES

CROSS-REFERENCE TO RELATED APPLICATION

This application is a National Stage Application under 35 U.S.C. § 371 and claims the benefit of International Application No. PCT/EP2019/053300, filed on Feb. 11, 2019, which claims priority to U.S. Provisional Application Ser. No. 62/628,913, filed on Feb. 9, 2019. The disclosure of the prior application is considered part of and is incorporated by reference in the disclosure of this application.

BACKGROUND

This specification relates to generating output examples using neural networks.

Neural networks are machine learning models that employ one or more layers of nonlinear units to predict an output for a received input. Some neural networks include one or more hidden layers in addition to an output layer. The output of each hidden layer is used as input to the next layer in the network, i.e., the next hidden layer or the output layer. Each layer of the network generates an output from a received input in accordance with current values of a respective set of parameters.

Some neural networks are recurrent neural networks. A recurrent neural network is a neural network that receives an input sequence and generates an output sequence from the input sequence. In particular, a recurrent neural network can use some or all of the internal state of the network from a previous time step in computing an output at a current time step.

An example of a recurrent neural network is a Long Short-Term Memory (LSTM) neural network that includes one or more LSTM memory blocks. Each LSTM memory block can include one or more cells that each include an input gate, a forget gate, and an output gate that allow the cell to store previous states for the cell, e.g., for use in generating a current activation or to be provided to other components of the LSTM neural network.

SUMMARY

This specification describes a system implemented as computer programs on one or more computers in one or more locations that generates output examples using a recurrent neural network by generating a respective output value at each of multiple generation time steps. Each output value in the output example is an N-bit value. At each generation time step, the system generates the values of the first half of the N bits and then generates the values of the second half of the N bits conditioned on the values of the first half of the N bits. For example, the system can generate the values of the N/2 most significant bits of an output value and then generate the values of the N/2 least significant bits of the output value conditioned on the already-generated values of the most significant bits.

Thus in once aspect there is provided a method of generating an output example comprising a respective N-bit output value at each generation time step of a sequence of generation time steps. The method may comprise, for each generation time step, processing a first recurrent input comprising the N-bit output value at the preceding generation time step in the sequence using a recurrent neural network and in accordance with a hidden state of the recurrent neural network to generate a first score distribution over possible values for a first half of the N bits in the output value at the generation time step, and selecting, using the first score distribution, values for the first half of the N bits of the output value. The method may comprise, for each generation time step, processing a second recurrent input comprising (i) the N-bit output value at the preceding generation time step in the sequence and (ii) the values for the first half of the N bits using the recurrent neural network and in accordance with the same hidden state to generate a second score distribution over possible values for a second half of the N bits in the output value at the generation time step, and selecting, using the second score distribution, values for the second half of the N bits of the output value.

As described further later, implementations of this method are adapted for implementation on a processing unit with limited computational ability and memory bandwidth, such as found in a mobile device. For example, implementations of the method use a computational architecture in which a processing unit is configured to split generating the N-bit output value into two halves, generating a first half of the N bits and then a second half of the N bits. By dividing the output space in this way, into two smaller output spaces rather than one large output space, the number of sequential matrix-vector product computations may be reduced by an order of magnitude, facilitating real-time implementation of the method.

Optionally the output value may be conditioned on a respective conditioning input at each of the generation time steps. The first recurrent input and the second recurrent input may each also comprise the conditioning input for the generation time step. Generating the conditioning input at the generation time step may comprise processing conditioning features using a conditioning neural network.

In implementations processing the first recurrent input may comprise processing the first recurrent input to generate a first half of an updated hidden state, and then processing the first half of the updated hidden state using one or more first output layers to generate the first score distribution. Processing the second recurrent input may comprise processing the second recurrent input to generate a second half of an updated hidden state, and processing the second half of the updated hidden state using the one or more second output layers to generate the second score distribution.

In particular implementations the one or more first output layers may be configured to apply a first weight matrix to the first half of the updated hidden state to generate a first projected updated hidden state. The method may then apply an element-wise non-linear activation function to the first projected updated hidden state to generate a first activation vector, apply a second weight matrix to the first activation vector to generate first logits, and then apply a softmax function to the first logits to generate the first score distribution. Similarly the one or more second output layers may be configured to apply a third weight matrix to the second half of the updated hidden state to generate a second projected updated hidden state. The method may then apply the element-wise non-linear activation function to the second projected updated hidden state to generate a second activation vector, apply a fourth weight matrix to the second activation vector to generate second logits, and apply the softmax function to the second logits to generate the second score distribution.

The recurrent neural network may include one or more gates. Processing the first recurrent input may then comprise determining a respective recurrent contribution for each gate by applying a recurrent weight matrix to the hidden state. The method may then further comprise, for each of the one or more gates, determining a first input contribution for the gate from the first recurrent input, determining a first gate vector for the gate from at least the recurrent contribution for the gate and the first input contribution for the gate, and generating the first half of the updated hidden state from the first gate vectors and the hidden state. Similarly processing the second recurrent input may comprise, for each of the one or more gates, determining a second input contribution for the gate from the second recurrent input, determining a second gate vector for the gate from at least the recurrent contribution for the gate and the second input contribution for the gate, and generating the second half of the updated hidden state from the second gate vectors and the hidden state.

In implementations processing the second recurrent input may comprise generating the second half of the updated hidden state without re-computing recurrent contributions for the gates from processing of the first recurrent input.

In implementations the recurrent neural network includes just a single recurrent layer. A single recurrent layer applied to a previous state of the recurrent neural network can provide a highly non-linear transformation of the context, which is represented in an already compressed form by the hidden state of the recurrent neural network. Thus this further facilitates deployment of the method on a processing unit with limited computational power.

In some implementations of the method the first half of the N bits are the most significant bits and the second half of the N bits are the least significant bits of the output example (data item). In some implementations values for the first and second halves of the N bits may be selected by sampling from, respectively, the first and second score distributions.

Implementations of the method allow loading parameters of the recurrent neural network into registers of the processing unit only once at the start of generating the output example. The parameters of the recurrent neural network may then persist in the registers throughout the generation of the output example. This can help to reduce the memory bandwidth used when implementing the method.

In some implementations the method operates on the processing unit of a mobile device such as a mobile phone.

In another aspect there is provided a processing unit configured for generating an output example comprising a respective N-bit output value at each generation time step of a sequence of generation time steps. The processing unit is configured to split the generating of the N-bit output value into two halves, to generate a first half of the N bits and then a second half of the N bits. The processing unit may be configured to, for each generation time step, process a first recurrent input comprising the N-bit output value at the preceding generation time step in the sequence using a recurrent neural network and in accordance with a hidden state of the recurrent neural network to generate a first score distribution over possible values for a first half of the N bits in the output value at the generation time step, and then select, using the first score distribution, values for the first half of the N bits of the output value. The processing unit may be further configured to, for each generation time step, process a second recurrent input comprising (i) the N-bit output value at the preceding generation time step in the sequence and (ii) the values for the first half of the N bits using the recurrent neural network and in accordance with the same hidden state to generate a second score distribution over possible values for a second half of the N bits in the output value at the generation time step, and then select, using the second score distribution, values for the second half of the N bits of the output value.

Particular embodiments of the subject matter described in this specification can be implemented so as to realize one or more of the following advantages.

By first generating the values for the first half of the N bits, e.g., the most significant bits, and then generating the values for the second half of the N bits, e.g., the least significant bits, conditioned on the values of the first half, the system improves the accuracy of the outputs generated. Moreover, the network can achieve this improved accuracy while being computationally compact. In particular, because the neural network includes only a single recurrent layer (and output layers that have relatively low computational cost) to operate on a conditioning input, the network can generate high-quality outputs quicker than conventional approaches. This may allow the network to be used in environments where outputs need to be generated in real-time, e.g., when deployed on a mobile device or another user device.

Additionally, the system can generate two outputs per time step without needing to re-compute computationally expensive matrix multiplies, i.e., by only computing the recurrent contribution to the updated hidden state once, minimizing the additional computation and processing power required to generate the second output.

Moreover, by generating separate score distributions over the first half of the bits and second half of the bits, the system reduces the output space, allowing for efficient prediction of multi-bit values. As a particular example, when N is 16, i.e., all of the values are 16-bit values, the neural network only requires two relatively small output spaces (two score distributions of $2^8$ scores each) instead of one large output space (with each time step needing to have a score distribution that has $2^{16}$ scores), reducing the amount of computation required to effectively predict 16-bit values.

The architecture of the network lends itself well to being optimized on a GPU or other special-purpose hardware, resulting in additional computational and time savings. For example, in implementations the network has only a single recurrent layer, and the size of the hidden state of the recurrent layer, i.e., the number of units in the hidden state, can be readily configured to optimize for the memory available on the special-purpose hardware.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes a system implemented as computer programs on one or more computers in one or more locations that generates output examples using a recurrent neural network. Each output example includes a respective output value at each of multiple generation time steps. In some cases, the system can generate the output example by conditioning the recurrent neural network on a conditioning input.

In some cases the system generates audio data and at each generation time step the output value may be e.g. a time-domain or frequency audio data value for defining an audio waveform. For example, the system can be part of a system that converts text to speech. In this example, the output example is a sequence of audio data, e.g., a waveform, that represents an utterance of a piece of text and the recurrent neural network is conditioned on a sequence of linguistic features of the piece of text. That is, at each generation time step, the conditioning input is a set of linguistic features and the output value is a value that defines the amplitude of the waveform. In some implementations, the audio value at each generation time step in the sequence is the amplitude of the audio waveform at the corresponding time, i.e., the output example is a raw audio waveform. In other implementations, the audio value at each generation time step in the sequence is a compressed or companded representation of the waveform at the corresponding time. For example, the audio value can be a μ-law transformed representation of the waveform. In other implementations the audio value at a time step may be for a STFT (short-time Fourier transform) representation of the audio waveform.

As another example, the system can generate image data for a still or moving image, e.g., conditioned on a caption or not conditioned on any explicit input. At each generation time step, the output value is a pixel value, e.g., a color value, i.e., an intensity value, for some color channel of some pixel of the image.

As another example, the system can be part of a speech recognition system. In this example, the output example is a sequence of text that represents a transcription of an utterance and the recurrent neural network is conditioned on a sequence of raw audio of the utterance or audio features of the utterance. That is, at each generation time step, the output value is data that identifies some unit of text, e.g., a word, a character, or a grapheme.

In particular, each output value in the output example is an N-bit value, e.g., a 4-bit value, 8-bit value, 16-bit value, or 24-bit value. That is, each output value in the output example 162 is represented as a sequence of N bits. For example, when the output example is a speech waveform, the output example can be an ordered, i.e., by time, collection of N-bit amplitude values or N-bit compressed or companded amplitude values.

Figure 1:
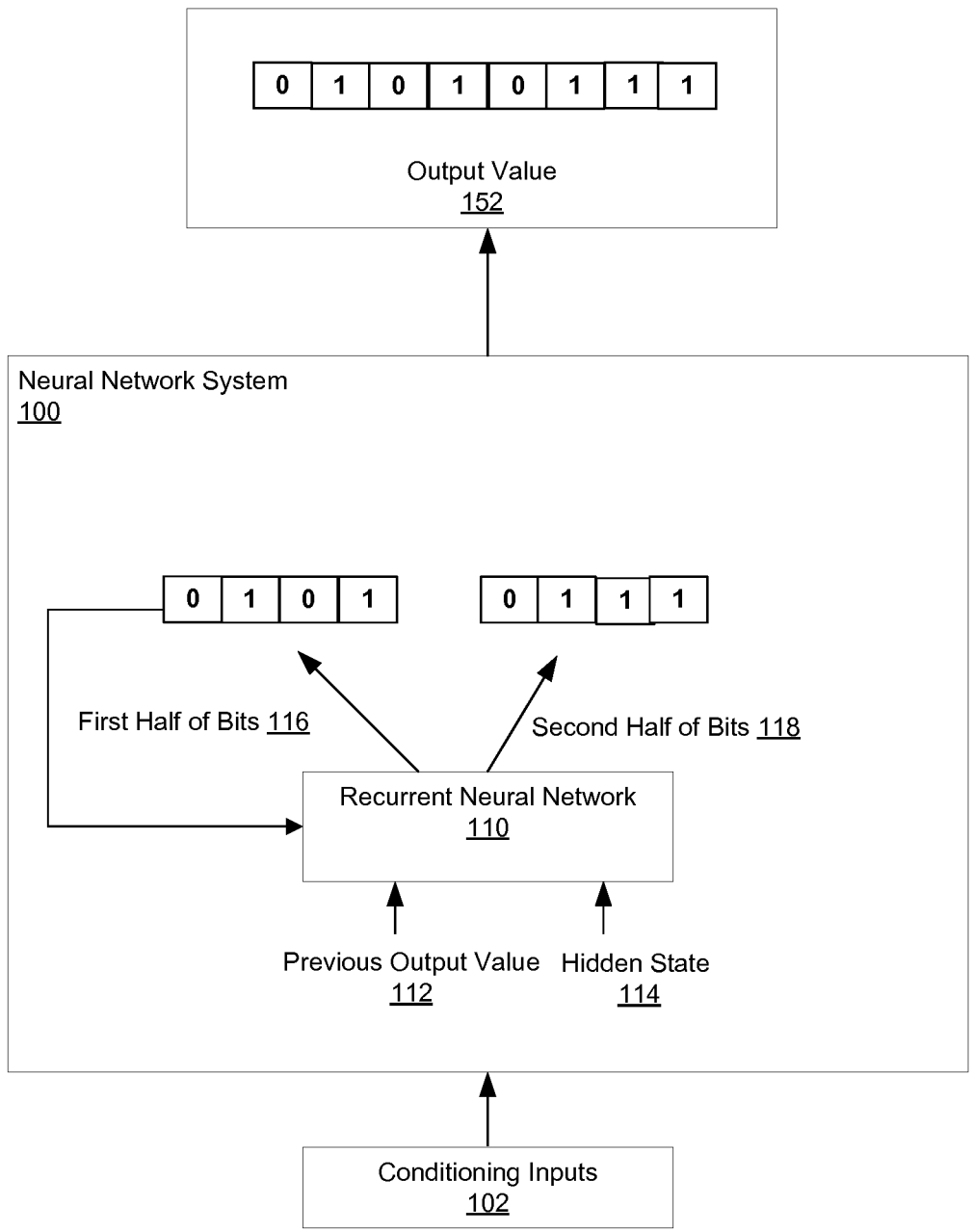
FIG. 1 shows an example neural network system.

FIG. 1 shows an example neural network system 100. The neural network system 100 is an example of a system implemented as computer programs on one or more computers in one or more locations, in which the systems, components, and techniques described below can be implemented.

The neural network system 100 generates an output example that includes multiple output values 152 by generating at least one output value 152 at each of multiple generation time steps. As described above, each output value is an N-bit value and is represented as a sequence of N bits. In the example of FIG. 1, the output value 152 is an 8-bit value, i.e., represented by the sequence of bits [0, 1, 0, 1, 0, 1, 1, 1].

At a given generation time step, the system 100 processes a first recurrent input that includes the previous output value 112, i.e., the N-bit output value at the preceding generation time step in the sequence, using a recurrent neural network 110 and in accordance with a hidden state 114 of the recurrent neural network 110 to generate a first score distribution over possible values for a first half of the N bits in the output value at the generation time step. If the output is conditioned on some external conditioning input, the first recurrent input also includes a conditioning input 102 for the generation time step.

The system 100 then selects, using the first score distribution, values 116 for the first half of the N bits of the output value, e.g., by sampling a sequence of N bits from the possible sequences of N bits in accordance with the score distribution. In the example of FIG. 1, the system 100 has selected the values [0, 1, 0, 1] as the values 116 of the first half of the N bits.

The system 100 then processes a second recurrent input that includes (i) the previous output value 112 and (ii) the values 116 for the first half of the N bits (and, if the output is conditioned on some input, the conditioning input 102 for the generation time step) using the recurrent neural network 110 and in accordance with the same hidden state 114 to generate a second score distribution over possible values for the second half of the N bits in the output value at the generation time step.

The system then selects, using the second score distribution, values 118 for the second half of the N bits of the output value, e.g., by sampling from the second score distribution. For example, the system 100 has selected the values [0, 1, 1, 1] as the values 118 for the second half of the bits, resulting in the output value 152 being represented as [0, 1, 0, 1, 0, 1, 1, 1].

Thus, at a given generation time step, the system first generates the values 116 for the first half of the N bits, e.g., the most significant bits, and then generates the values 118 for the second half of the N bits, e.g., the least significant bits, conditioned on the values of the first half of the N bits.

The architecture of the recurrent neural network 110 and the operations performed by the recurrent neural network to generate an output value are described below with reference to FIG. 2.

By generating output examples in this manner and using a recurrent neural network as described in this specification, the system 100 generates accurate outputs with minimal latency and while consuming fewer computational resources. Thus, the system 100 may be implemented, for example, on a mobile device, on a smart speaker, or on another resource-constrained computer that nonetheless requires high-quality output examples to be generated with low latency.

Figure 2:
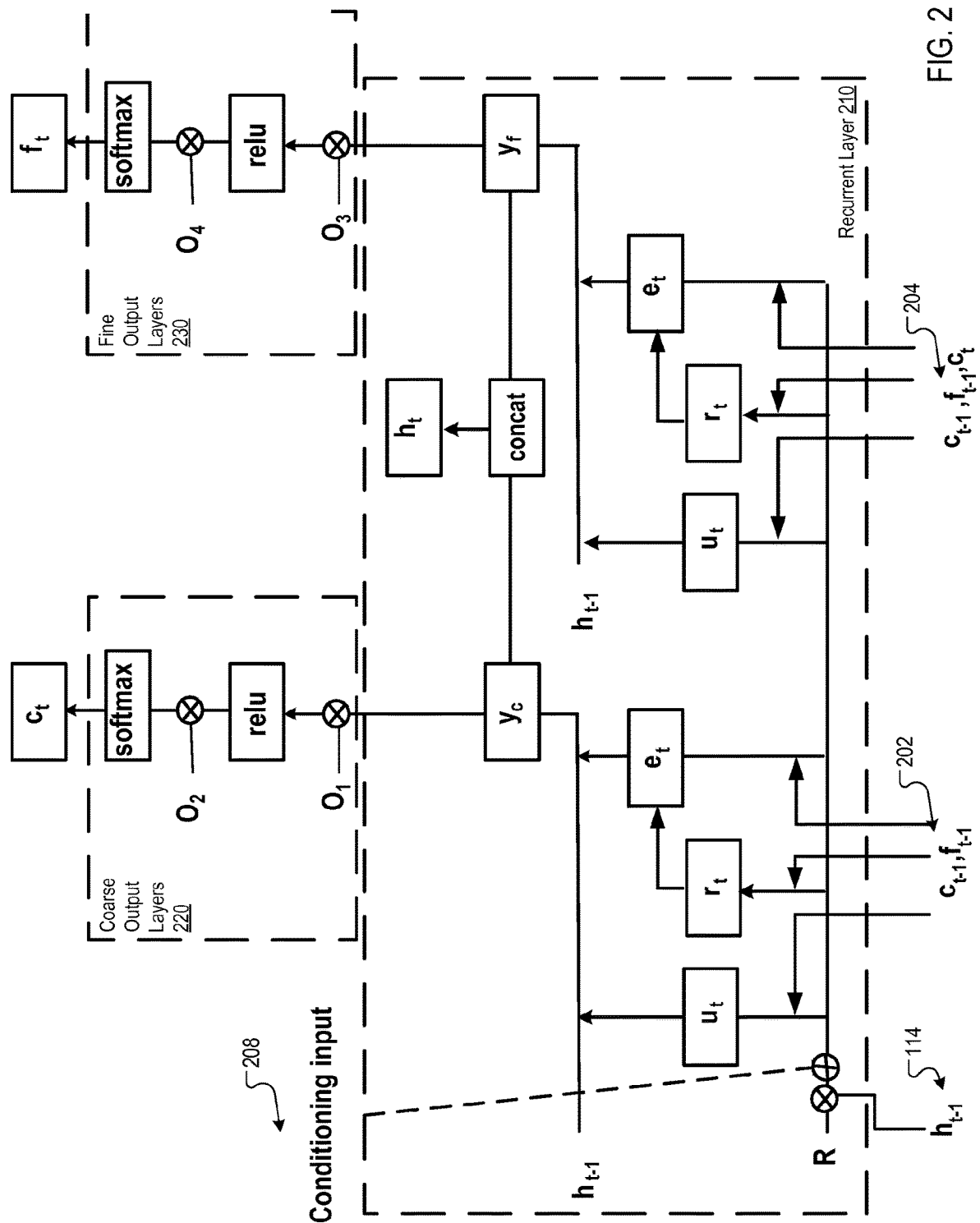
FIG. 2 is a diagram showing the processing performed by the recurrent neural network to generate an output value at a generation time step.

FIG. 2 is a diagram showing the processing performed by the recurrent neural network 110 to generate an output value 152 at a generation time step t.

The processing shown in the diagram can be repeated for multiple generation time steps to generate each output value in an output example.

As shown in FIG. 2, the recurrent neural network 110 includes only a single recurrent neural network layer 210, i.e., as opposed to multiple recurrent neural network layers stacked one after the other. The recurrent neural network 110 also includes a set of one or more coarse output layers 220 and a set of one or more fine output layers 230.

Generally, the single recurrent neural network layer 210 maintains a hidden state h that is updated at each generation time step. The hidden state is a vector of numeric values.

At generation time step t, the recurrent neural network 110 receives a first input 202 that includes the output value generated at the preceding generation time step, i.e., a combination of the values for the first half of bits $c_{t-1}$ from the preceding output value and the values of the second half of bits $f_{t-1}$ from the preceding output value. For example, the system can encode $c_{t-1}$ and $f_{t-1}$ as scalars in the range of [0,2^(N/2)−1] and then scale the scalars to the appropriate interval for processing by the recurrent neural network, e.g., [−1,1].

The recurrent neural network 110 processes the first input 202 in accordance with the hidden state from the previous generation time step $h_{t-1}$ to generate a first score distribution over possible values for the first half of the bits. In other words, the score distribution includes a respective score for each possible combination of values for the first half of the N bits. For example, when N is 16, the score distribution will include a respective score for each of the 2^8 possible combinations of values for the first 8 bits of the output value.

The system then selects the values of the first half of the bits (the "coarse bits") $c_t$ using the score distribution, e.g., by sampling from the score distribution or selecting the combination of values with the highest score.

The recurrent neural network 110 then processes a second input 204 that includes the output value generated at the preceding generation time step ($c_{t-1}$, $f_{t-1}$) and the values $c_t$ (in accordance with $h_{t-1}$) to generate a second score distribution over possible values for the second half of the bits (the "fine bits"). For example, the system can encode $c_t$ in the same manner as $c_{t-1}$ and $f_{t-1}$ to generate the second input 204. Like the first score distribution, the second score distribution includes a respective score for each possible combination of values for the second half of the N bits. The system then selects the second half of the bits $f_t$ using the second score distribution.

In particular, the recurrent layer 210 processes the first input 202 in accordance with $h_{t-1}$ to generate the first half $y_c$ of the updated hidden state $h_t$ for the generation time step t.

To generate $y_c$, the recurrent layer 210 determines a respective recurrent contribution for each gate in a set of one or more gates of the recurrent layer 210 by applying a recurrent weight matrix R to the hidden state $h_{t-1}$. In other words, the recurrent layer 210 computes a matrix-vector product between R and $h_{t-1}$ to generate a vector that includes the recurrent contributions for each of the gates, i.e., with different portions of the vector corresponding to different gates.

The recurrent layer 210 then determines, for each gate, a respective input contribution for the gate from the first input 202 and determines the gate vector for the gate from at least the recurrent contribution for the gate and the input contribution for the gate. In the example of FIG. 2, the recurrent layer 210 has three gates u, r, and e and therefore computes three gate vectors $u_t$, $r_t$, and $e_t$. In particular, in the example of FIG. 2, the gate vectors $u_t$, $r_t$, and $e_t$ satisfy:

$$u_t = \sigma(rc_u + I_u^* x_t),$$

$$r_t = \sigma(rc_r + I_r^* x_t), \text{ and}$$

$$e_t = \tau(r_t \circ rc_e + I_e^* x_t),$$

where σ is e.g. the sigmoid non-linear function, $rc_u$ is the recurrent contribution for gate u, $I_u^*$ is an input weight matrix for the gate u that is masked such that $c_t$ does not affect the first half of the state $y_c$, $x_t$ is an input to the recurrent layer, i.e., either the first input 202 or the second input 204, $rc_r$ is the recurrent contribution for gate r, $I_r^*$ is an input weight matrix for the gate r that is masked such that $c_t$ does not affect the first half of the state $y_c$, τ is e.g. the tanh non-linear function, ∘ denotes element-wise multiplication, $rc_e$ is the recurrent contribution for gate e, and $I_e^*$ is an input weight matrix for the gate e that is masked such that $c_t$ does not affect the first half of the state $y_c$. In other words, the matrices I are masked such that, when $x_t$ is the second input 204, the values of $c_t$ being missing does not affect the first half of the resulting hidden state $h_t$ as shown below. While not shown in the above equations, some or all of the gates can include an addition of one or more bias vectors for the gate as part of the calculation of the gate vector for the gate, i.e., before the application of the non-linearity for the gate.

The recurrent layer 210 then computes $y_c$ from $h_{t-1}$ and the gate vectors. In the example of FIG. 2, $y_c$ is the first half of the temporary hidden state $h_t$ that is computed as:

$$h_t = u_t \circ h_{t-1} + (1 - u_t) \circ e_t$$

In other words, the recurrent layer 210 splits $h_t$ computed as above into two vectors and uses the first vector as $y_c$.

The set of coarse output layers 220 then processes $y_c$ to generate the score distribution over values for the first half of bits.

In particular, in the example of FIG. 2, the coarse output layers 220 are configured to apply a first weight matrix $O_1$ to $y_c$ to generate a first projected updated hidden state, apply an element-wise non-linear activation function (e.g., the rectified liner unit ("relu") function) to the first projected updated hidden state to generate a first activation vector, apply a second weight matrix $O_2$ to the first activation vector to generate first logits, and apply a softmax function ("softmax") to the first logits to generate the first score distribution.

Once the system has selected the first half of bits $y_c$, the recurrent layer 210 processes the second input 202 in accordance with $h_{t-1}$ to generate the second half $y_f$ of the updated hidden state $h_t$. In particular, the final updated hidden state $h_t$ is a concatenation ("concat") of $y_c$ and $y_f$. In other words, the final updated hidden state $h_t$ can be split into $y_c$ and $y_f$.

To generate $y_f$, the recurrent layer 210 re-computes the gate vectors for the set of gates by using the second input 204 instead of the first input 202 and then computes $y_f$ from $h_{t-1}$ and the re-computed gate vectors. Advantageously, when re-computing the gate vectors for the set of gates, the recurrent layer 210 re-uses and does not re-compute the recurrent contributions to the gates from the processing of the first input 202.

In other words, when determining the gate vectors for the second input 204, the recurrent layer 210 does not re-compute the matrix-vector product between R and $h_{t-1}$ and only re-computes the input contributions for the respective gates by using the second input 204 as $x_t$ in the equations above.

The recurrent layer 210 then computes $y_f$ from $h_{t-1}$ and the re-computed gate vectors as described above, but with $y_f$ being the second half of the updated hidden state $h_t$ (and not the first half as described above for computing $y_c$).

The set of fine output layers 230 then processes $y_f$ to generate the score distribution over values for the second half of bits.

In particular, in the example of FIG. 2, the fine output layers 230 are configured to apply a weight matrix $O_3$ to $y_f$ to generate a second projected updated hidden state, apply an element-wise non-linear activation function (e.g., the rectified liner unit ("relu") function) to the second projected updated hidden state to generate a second activation vector, apply a weight matrix $O_4$ to the second activation vector to generate second logits, and apply a softmax function ("softmax") to the second logits to generate the second score distribution.

Thus, as can be seen from the description of FIG. 2, the recurrent neural network 120 is able to generate the output value at the generation time step by generating two score distributions over small output spaces instead of one score distribution over a large output space. This allows the output value to be generated in a more computationally efficient manner.

As a particular example, when N is 16, i.e., all of the values are 16-bit values, the neural network only requires two relatively small output spaces (two score distributions of 2^8 scores each) instead of one large output space (with each time step needing to have 2^16 scores), reducing the amount of computation required to effectively predict 16-bit values. In particular, the matrices O can be of a much smaller size than the matrices that would be required to project the hidden state $h_t$ into a vector having 2^16 values.

Moreover, the recurrent layer 210 computes $y_f$ without needing to re-compute the matrix-vector product involving R, which is the most computationally-intensive operation performed by the recurrent layer 210, i.e., because the operation involves multiplying a large matrix by a large vector. Thus, only a limited amount of relatively less computationally-intensive operations need to be added in order to allow for generating the output value in two passes at a given time step.

Further, the recurrent neural network 120 includes only a single recurrent layer. Because the recurrent layer has a hidden state that maintains an already compressed representation of the context for a given output value, an RNN is able to combine the context with the input within a single transformation. Thus, the recurrent neural network 120 is able to avoid using a deep and narrow architecture requiring a long chain of layers to be executed for each value and drastically reduces the number of operations that need to be performed at each time step.

When a conditioning input is used to further condition the generation of the output value, both the first input 202 and the second input 204 also include the conditioning input for the generation time step. In particular, the recurrent neural network can process received conditioning features, e.g., linguistic features, through a conditioning neural network that includes one or more neural network layers, e.g., convolutional layers, to generate a conditioning input 208 that is a vector that has the same dimensionality as the hidden state. Each of the gate vectors can then be based on the conditioning input 208. The conditioning input 208 can be applied at any appropriate point before the gate vectors are calculated. In the example shown in FIG. 2, the conditioning input 208 is added to each of the recurrent contributions, i.e. after the matrix-vector product between R and $h_{t-1}$ has been computed. This can then be re-used instead of needing to be re-computed when the gate vectors are re-computed.

Figure 3:
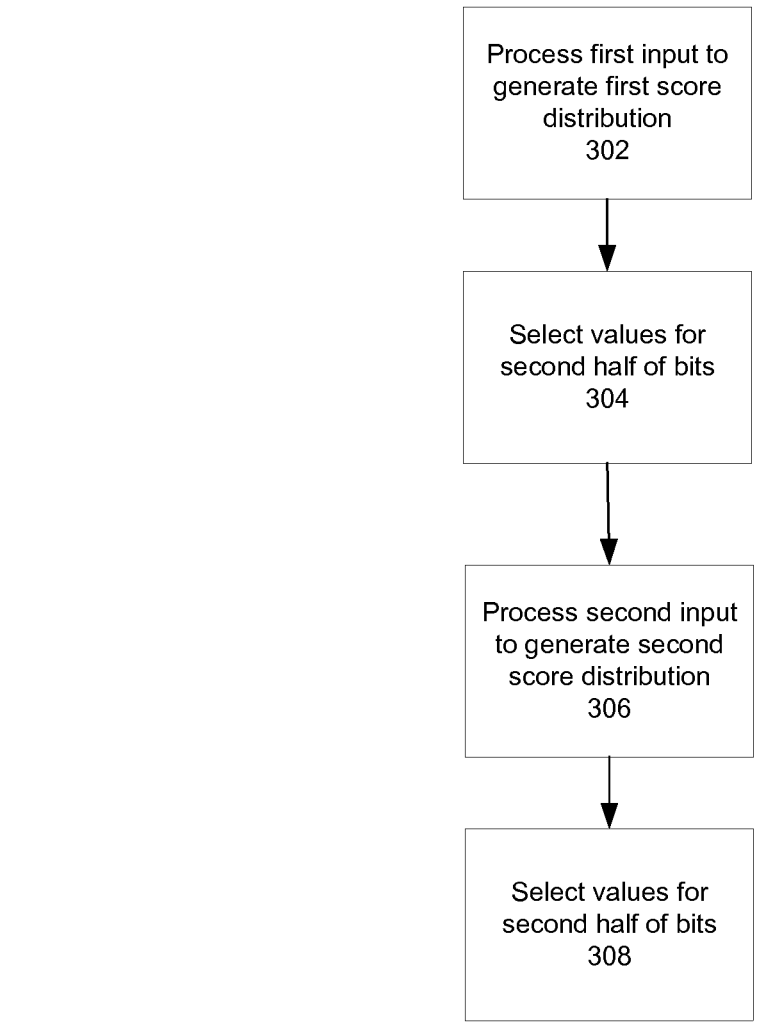
FIG. 3 is a flow diagram of an example process for generating an output example.

FIG. 3 is a flow diagram of an example process 300 for generating an output value. For convenience, the process 300 will be described as being performed by a system of one or more computers located in one or more locations. For example, a neural network system, e.g., the neural network system 100 of FIG. 1, appropriately programmed, can perform the process 300.

The system can repeat the process 300 at multiple generation time steps to generate an output example that includes multiple N-bit output values.

The system processes a first input to generate a first score distribution (step 302). In particular, the first input includes the preceding output value generated at the preceding time step and, when the output example is conditioned on a conditioning input, a conditioning input for the generation time step.

The system selects values for the first half of the N bits from the first score distribution (step 304), e.g., by sampling from the first score distribution The system processes a second input to generate a second score distribution (step 306). The second input includes the preceding output value and the values of the first half of bits from the current output value.

The system selects values for the second half of the N bits from the second score distribution (step 308), e.g., by sampling from the second score distribution.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

In this specification, the term "database" is used broadly to refer to any collection of data: the data does not need to be structured in any particular way, or structured at all, and it can be stored on storage devices in one or more locations. Thus, for example, the index database can include multiple collections of data, each of which may be organized and accessed differently.

Similarly, in this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back end component, e.g., as a data server, or that includes a middleware component, e.g., an application server, or that includes a front end component, e.g., a client computer having a graphical user interface, a web browser, or an app through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of generating an output example comprising a respective N-bit output value at each generation time step of a sequence of generation time steps, the method comprising, for each generation time step:
   processing, by a set of one or more computers, a first recurrent input comprising the N-bit output value at the preceding generation time step in the sequence using a recurrent neural network implemented on the set of one or more computers and in accordance with a hidden state of the recurrent neural network to generate a first score distribution over possible values for a first half of the N bits in the output value at the generation time step;
   selecting, by the set of one or more computers and using the first score distribution, values for the first half of the N bits of the output value;
   processing, by the set of one or more computers, a second recurrent input comprising (i) the N-bit output value at the preceding generation time step in the sequence and (ii) the values for the first half of the N bits using the recurrent neural network and in accordance with the same hidden state to generate a second score distribution over possible values for a second half of the N bits in the output value at the generation time step; and
   selecting, by the set of one or more computers and using the second score distribution, values for the second half of the N bits of the output value.

2. The method of claim 1, wherein the output value is conditioned on a respective conditioning input at each of the generation time steps, and wherein the first recurrent input and the second recurrent input each also comprise the conditioning input for the generation time step.

3. The method of claim 2, further comprising:
   generating the conditioning input at the generation time step by processing conditioning features using a conditioning neural network.

4. The method of claim 1, wherein the recurrent neural network comprises one or more first output layers and one or more second output layers, and wherein processing the first recurrent input comprises:
   processing the first recurrent input to generate a first half of an updated hidden state; and
   processing the first half of the updated hidden state using the one or more first output layers to generate the first score distribution.

5. The method of claim 4, wherein processing the second recurrent input comprises: processing the second recurrent input to generate a second half of an updated hidden state; and
   processing the second half of the updated hidden state using the one or more second output layers to generate the second score distribution.

6. The method of claim 5, wherein the one or more first output layers are configured to:
   apply a first weight matrix to the first half of the updated hidden state to generate a first projected updated hidden state,
   apply an element-wise non-linear activation function to the first projected updated hidden state to generate a first activation vector,
   apply a second weight matrix to the first activation vector to generate first logits, and
   apply a softmax function to the first logits to generate the first score distribution.

7. The method of claim 6, wherein the one or more second output layers are configured to:
   apply a third weight matrix to the second half of the updated hidden state to generate a second projected updated hidden state,
   apply the element-wise non-linear activation function to the second projected updated hidden state to generate a second activation vector,
   apply a fourth weight matrix to the second activation vector to generate second logits, and
   apply the softmax function to the second logits to generate the second score distribution.

8. The method of claim 5, wherein the recurrent neural network includes one or more gates, and wherein processing the first recurrent input comprises:
   determining a respective recurrent contribution for each gate by applying a recurrent weight matrix to the hidden state; and
   for each of the one or more gates:
     determining a first input contribution for the gate from the first recurrent input, and
     determining a first gate vector for the gate from at least the recurrent contribution for the gate and the first input contribution for the gate; and
   generating the first half of the updated hidden state from the first gate vectors and the hidden state.

9. The method of claim 8, wherein processing the second recurrent input comprises:
   for each of the one or more gates:
     determining a second input contribution for the gate from the second recurrent input, and
     determining a second gate vector for the gate from at least the recurrent contribution for the gate and the second input contribution for the gate; and generating the second half of the updated hidden state from the second gate vectors and the hidden state.

10. The method of claim 9, wherein processing the second recurrent input comprises generating the second half of the updated hidden state without re-computing the recurrent contributions for the gates from the processing of the first recurrent input.

11. The method of claim 1, wherein the recurrent neural network includes a single recurrent layer.

12. The method of claim 1, wherein the first half of the N bits are the most significant bits and the second half of the N bits are the least significant bits.

13. The method of claim 1, wherein selecting, using the first score distribution, values for the first half of the N bits of the output value comprises sampling the values from the first score distribution, and wherein selecting, using the second score distribution, values for the second half of the N bits of the output value comprises sampling the values from the second score distribution.

14. The method of claim 1, further comprising loading parameters of the recurrent neural network into registers of a processing unit only once at the start of generating the output example, wherein the parameters of the recurrent neural network persist in the registers throughout the generating the output example.

15. The method of claim 1 wherein the set of one or more computers are a mobile device.

16. The method of claim 1, wherein the respective output values at each generation time step are audio data values that define an audio waveform.

17. The method of claim 16, wherein:
the audio waveform represents an utterance of a piece of text for converting text to speech.

18. A system comprising one or more computers and one or more storage devices storing instructions that when executed by the one or more computers cause the one or more computers to perform operations for generating an output example comprising a respective N-bit output value at each generation time step of a sequence of generation time steps, the operations comprising, for each generation time step:
processing a first recurrent input comprising the N-bit output value at the preceding generation time step in the sequence using a recurrent neural network implemented on the one or more computers and in accordance with a hidden state of the recurrent neural network to generate a first score distribution over possible values for a first half of the N bits in the output value at the generation time step;
selecting, using the first score distribution, values for the first half of the N bits of the output value;
processing a second recurrent input comprising (i) the N-bit output value at the preceding generation time step in the sequence and (ii) the values for the first half of the N bits using the recurrent neural network and in accordance with the same hidden state to generate a second score distribution over possible values for a second half of the N bits in the output value at the generation time step; and
selecting, using the second score distribution, values for the second half of the N bits of the output value.

* * * * *